United States Patent
Matsui et al.

(10) Patent No.: US 11,626,258 B2
(45) Date of Patent: Apr. 11, 2023

(54) SOLAR CELL

(71) Applicant: Panasonic Intellectual Property Management Co., Ltd., Osaka (JP)

(72) Inventors: Taisuke Matsui, Osaka (JP); Ryosuke Kikuchi, Osaka (JP); Tomoyasu Yokoyama, Osaka (JP); Fumiyasu Oba, Kanagawa (JP); Yu Kumagai, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 17/483,637

(22) Filed: Sep. 23, 2021

(65) Prior Publication Data

US 2022/0013303 A1    Jan. 13, 2022

Related U.S. Application Data

(63) Continuation of application No. PCT/JP2019/039469, filed on Oct. 7, 2019.

(30) Foreign Application Priority Data

Apr. 11, 2019   (JP) .............................. JP2019-075738

(51) Int. Cl.
   *H01L 31/00*  (2006.01)
   *H01G 9/20*   (2006.01)
(52) U.S. Cl.
   CPC ......... *H01G 9/2036* (2013.01); *H01G 9/2009* (2013.01)

(58) Field of Classification Search
   CPC .......................... H01G 9/2036; H01G 9/2009
   See application file for complete search history.

(56) References Cited

PUBLICATIONS

Lv et al., "Optical properties and UV photoresponse of Na2xZn1-xO thin film", J Mater Sci: Mater Electron (2017) 28: 1022-1027 (Year: 2017).*
The Extended European Search Report, dated May 9, 2022, for the related European Patent Application No. 19924078.9.
Randi Azmi et al: "High Efficiency Low-Temperature Processed Perovskite Solar Cells Integrated with Alkali Metal Doped ZnO Electron Transport Layers", ACS Energy Letters, vol. 3, No. 6, May 1, 2018 (May 1, 2018), pp. 1241-1246, XP055747451.
International Search Report of PCT application No. PCT/JP2019/039469 dated Nov. 19, 2019.
Julian Burschka et al., "Sequential deposition as a route to high-performance perovskite-sensitized solar cells", Nature, vol. 499, Jul. 10, 2013, pp. 316-319 [DOI:10.1038/nature12340].

(Continued)

*Primary Examiner* — Thanh Truc Trinh
(74) *Attorney, Agent, or Firm* — Greenblum & Bernstein, P.L.C.

(57) ABSTRACT

A solar cell according to the present disclosure includes a first electrode, a second electrode, a photoelectric conversion layer located between the first electrode and the second electrode, and a semiconductor layer located between the first electrode and the photoelectric conversion layer, in which at least one selected from the group consisting of the first electrode and the second electrode is translucent, and the semiconductor layer contains a compound containing Na, Zn, and O.

8 Claims, 3 Drawing Sheets

(56) References Cited

PUBLICATIONS

Nam-Gyu Park et al., "Research Direction toward Theoretical Efficiency in Perovskite Solar Cells", ACS Photonics, 5, Jul. 2, 2018, pp. 2970-2977 [DOI:1 0.1021/acsphotonics.8b00124].
Taisuke Matsui et al., "Room-Temperature Formation of Highly Crystalline Multication Perovskites for Efficient, Low-Cost Solar Cells", Advanced Materials, vol. 29, Issue 15, Jan. 20, 2017, 1606258 [DOI:10.1002/adma.201606258].

* cited by examiner

SOLAR CELL

BACKGROUND

1. Technical Field

The present disclosure relates to a solar cell.

2. Description of the Related Art

In recent years, perovskite solar cells have been researched and developed. In perovskite solar cells, a perovskite compound represented by the chemical formula $ABX_3$ is used as a light-absorbing material, where A is a monovalent cation, B is a divalent cation, and each X is a halogen anion.

A perovskite compound represented by the chemical formula $CH_3NH_3PbI_3$ has been disclosed as a light-absorbing material of a perovskite solar cell, and in addition, $TiO_2$ and Spiro-OMeTAD have been disclosed as an electron transport material and a hole transport material, respectively (see "Sequential deposition as a route to high-performance perovskite-sensitized solar cells", Nature, vol. 499, pp. 316-319, Jul. 18, 2013 [DOI: 10.1038/nature12340]).

SUMMARY

One non-limiting and exemplary embodiment provides a technique for increasing the conversion efficiency of a solar cell.

In one general aspect, the techniques disclosed here feature a solar cell including a first electrode, a second electrode, a photoelectric conversion layer located between the first electrode and the second electrode, and a semiconductor layer located between the first electrode and the photoelectric conversion layer, in which at least one selected from the group consisting of the first electrode and the second electrode is translucent, and the semiconductor layer contains a compound containing Na, Zn, and O.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Definition of Terms

The term "perovskite compound" used in this specification refers to a perovskite crystal structure represented by the chemical formula $ABX_3$ (where A is a monovalent cation, B is a divalent cation, and each X is a halogen anion) and a structure having a crystal similar thereto. The term "perovskite solar cell" used in this specification refers to a solar cell containing a perovskite compound as a light-absorbing material.

Underlying Knowledge Forming Basis of the Present Disclosure

The underlying knowledge forming the basis of the present disclosure will be described below.

In recent years, the conversion efficiency of perovskite solar cells has been greatly improved. The conversion efficiency of a solar cell is expressed by the product of the voltage value and the current value. For perovskite solar cells, current values close to the theoretical limit have been reported. However, there still remains a discrepancy between the reported voltage values and the theoretical limit value. The improvement of the voltage value is an important factor in improving the conversion efficiency (see "Research Direction toward Theoretical Efficiency in Perovskite Solar Cells", ACS Photonics, 2018, 5 (8), pp 2970-2977 [DOI: 10,1021/acsphotonics.8b00124]).

In general, losses of voltage values in solar cells are believed to be attributed to interface losses. To improve such a voltage value, a reduction in interface loss is conceivable. The inventors have found that the arrangement of a semiconductor layer containing a compound containing Na, Zn, and O between a photoelectric conversion layer and an electrode is less likely to form a deep defect level, which can be a loss factor, at the interface therebetween to suppress the interface loss. In the related art, in the case of crystalline solar cells, such as gallium arsenide solar cells and silicon solar cells, which have interfaces composed of homogeneous materials (i.e., homo-interfaces), a reduction in defect density at the interfaces enables a relatively easy reduction in interface loss. Perovskite solar cells, on the other hand, have interfaces composed of different materials (i.e., hetero-interfaces). For this reason, it is difficult to reduce the defect density at the interfaces in perovskite solar cells. According to a technique of the present disclosure based on the above findings, however, it is possible to achieve improvements of voltage values and conversion efficiency in perovskite solar cells. This technique can also be used for CIS-based solar cells and organic solar cells. The improvement of the voltage value can be recognized as an improvement in open-circuit voltage.

Embodiments of the Present Disclosure

Embodiments of the present disclosure will be described below with reference to the drawings.

Figure 1:
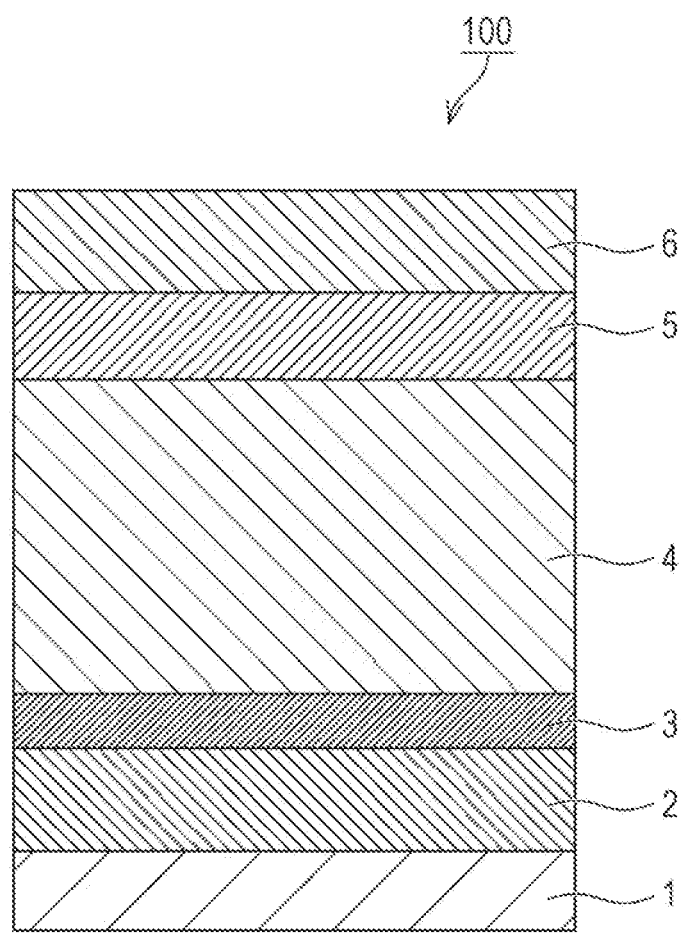
FIG. 1 is a cross-sectional view of a solar cell according to an embodiment of the present disclosure.

FIG. 1 is a cross-sectional view of a solar cell according to an embodiment. As illustrated in FIG. 1, a solar cell 100 according to this embodiment includes a first electrode 2, a second electrode 6, a photoelectric conversion layer 4, and a semiconductor layer 3. The photoelectric conversion layer 4 is located between the first electrode 2 and the second electrode 6. The semiconductor layer 3 is located between the first electrode 2 and the photoelectric conversion layer 4. The first electrode 2 is opposite the second electrode 6 in such a manner that the semiconductor layer 3 and the photoelectric conversion layer 4 are disposed between the first electrode 2 and the second electrode 6. At least one electrode selected from the group consisting of the first electrode 2 and the second electrode 6 is translucent. In this specification, the phrase "the electrode is translucent" indicates that 10% or more of light having a wavelength of greater than or equal to 200 nm and less than or equal to 2,000 nm is transmitted through the electrode at a specific wavelength.

The semiconductor layer 3 contains Compound A containing Na, Zn, and O. Compound A is usually a semiconductor. Compound A may be in the form of crystals. Compound A may be $Na_2Zn_2O_3$. In other words, the semiconductor layer 3 may contain $Na_2Zn_2O_3$. However, the composition of Compound A is not limited to $Na_2Zn_2O_3$. The semiconductor layer 3 may contain two or more types of compounds A having different compositions. The fact that the semiconductor layer 3 contains $Na_2Zn_2O_3$ crystals can be verified by XRD.

The composition ratio (Na/Zn) of Na to Zn in Compound A may be greater than or equal to 0.769. The above composition ratio is an atomic ratio. When the composition ratio (Na/Zn) is greater than or equal to 0.769, $Na_2Zn_2O_3$ is easily formed. The composition ratio (Na/Zn) of Na to Zn in Compound A may be less than or equal to 2.333. When the composition ratio (Na/Zn) is less than or equal to 2.333, the formation of Compound A having a composition other than $Na_2Zn_2O_3$ is inhibited. The composition ratio (Na/Zn) may be greater than or equal to 0.769 and less than or equal to 2.333.

The semiconductor layer 3 may be formed of multiple layers having the same composition or multiple layers having different compositions from each other. In the case where the semiconductor layer 3 is formed of multiple layers, the layer adjacent to the photoelectric conversion layer 4 may contain Compound A.

The semiconductor layer 3 may also be the electron transport layer.

The semiconductor layer 3 may contain a substance other than Compound A. This substance is usually a semiconductor. The substance that can be contained in the semiconductor layer 3 is, for example, Semiconductor S1 having a band gap of greater than or equal to 3.0 eV. In the case where the semiconductor layer 3 contains Semiconductor S1 and Compound A, the transmission of the visible and infrared light to the photoelectric conversion layer 4 through the semiconductor layer 3 is more reliable. Examples of Semiconductors S1 include n-type organic semiconductors and n-type inorganic semiconductors.

Examples of n-type organic semiconductors include imide compounds, quinone compounds, fullerenes, and derivatives thereof. Examples of n-type inorganic semiconductors include oxides of metal elements and perovskite oxides. Examples of metal elements include Cd, Zn, In, Pb, Mo, W, Sb, Bi, Cu, Hg, Ti, Ag, Mn, Fe, V, Sn, Zr, Sr, Ga, and Cr, Specific examples of metal oxides include $TiO_2$. Examples of perovskite oxides include $SrTiO_3$ and $CaTiO_3$.

The semiconductor layer 3 may contain a substance having a band gap of greater than 6.0 eV. Examples of the substance having a band gap of greater than 6.0 eV include (i) alkali metal halides, such as lithium fluoride, (ii) alkaline-earth metal halides, such as calcium fluoride, (iii) base metal oxides, such as magnesium oxide, and (iv) silicon dioxide. In the case where the semiconductor layer 3 contains the substance and is an electron transport layer, the semiconductor layer 3 has a thickness of less than or equal to, for example, 10 nm to ensure electron transportability.

The semiconductor layer 3 may be in contact with the photoelectric conversion layer 4. The semiconductor layer 3 may be in contact with the first electrode 2.

The solar cell 100 illustrated in FIG. 1 includes the first electrode 2, the semiconductor layer 3, the photoelectric conversion layer 4, a hole transport layer 5, and the second electrode 6 stacked, in this order, on a substrate 1. In the solar cell of present disclosure, the second electrode 6, the hole transport layer 5, the photoelectric conversion layer 4, the semiconductor layer 3, and the first electrode 2 may be stacked on the substrate 1 in that order. The solar cell of present disclosure need not include the substrate 1, The solar cell of the present disclosure need not include a hole transport layer 5.

The basic operation and effect of the solar cell 100 will be described. When the solar cell 100 is irradiated with light, the photoelectric conversion layer 4 absorbs the light to generate excited electrons and holes. The excited electrons move to the semiconductor layer 3. Holes move to hole transport layer 5. The semiconductor layer 3 and the hole transport layer 5 are electrically coupled to the first electrode 2 and the second electrode 6, respectively. Current is drawn from the first electrode 2 serving as a negative electrode and the second electrode 6 serving as a positive electrode.

Hereinafter, each component of solar cell 100 will be specifically described.

Substrate 1

The substrate 1 supports the layers included in the solar cell 100. The substrate 1 can be formed of a transparent material. Examples of the substrate 1 include a glass substrate and a plastic substrate. The plastic substrate can be a plastic film. The solar cell 100 need not include the substrate 1 when the first electrode 2 has sufficient strength to support the layers.

First Electrode 2 and Second Electrode 6

The first electrode 2 and the second electrode 6 are conductive. At least one electrode selected from the group consisting of the first electrode 2 and the second electrode 6 is translucent. The translucent electrode transmits light belonging to, for example, the visible to near-infrared region. The translucent electrode can be composed of, for example, a transparent and conductive metal oxide. Examples of the transparent and conductive metal oxide include (i) indium-tin composite oxides; (ii) antimony-doped zinc oxides; (iii) fluorine-doped tin oxides; (iv) zinc oxide doped with at least one element selected from the group consisting of boron, aluminum, gallium, and indium; and (v) composites thereof.

The translucent electrode may be an electrode that is composed of a non-transparent material and that has a pattern shape through which light can be transmitted. Examples of the pattern shape through which light can be transmitted include line (striped) shapes, wavy-line shapes, grid (mesh) shapes, and perforated metal shapes with a large number of fine through-holes arranged regularly or irregularly. In the electrode having the above-mentioned pattern shape, light can be transmitted through an opening portion where the electrode material for the electrode is not disposed. Examples of non-transparent material include platinum, gold, silver, copper, aluminum, rhodium, indium, titanium, iron, nickel, tin, zinc, and alloys containing any of these materials. The material may be an electrically conductive carbon material.

The solar cell 100 includes the semiconductor layer 3 between the first electrode 2 and the photoelectric conversion layer 4. For this reason, the first electrode 2 need not have the property of blocking holes moving from the photoelectric conversion layer 4. The first electrode 2 can be composed of a material that can form an ohmic contact with the photoelectric conversion layer 4.

In the case where the solar cell 100 does not include the hole transport layer 5, the second electrode 6 has the property of blocking electrons moving from the photoelectric conversion layer 4 (hereinafter, referred to as "electron-blocking properties"). In this case, the second electrode 6 does not form an ohmic contact with the photoelectric conversion layer 4. In this specification, the term "electron-blocking properties" indicates that only holes generated in the photoelectric conversion layer 4 are allowed to pass therethrough, and electrons are not allowed to pass therethrough. The Fermi energy level of the material having the electron-blocking properties is lower than the energy level of the conduction band minimum of the photoelectric conversion layer 4. The Fermi energy level of the material having the electron-blocking properties may be lower than the Fermi energy level of the photoelectric conversion layer 4. Examples of the material having the electron-blocking properties include platinum, gold, and carbon materials, such as graphene. These materials do not transmit light. Accordingly, when these materials are used to form translucent electrodes, for example, electrodes each having the pattern shape as described above are used.

In the case where the solar cell 100 includes the hole transport layer 5 between the second electrode 6 and the photoelectric conversion layer 4, the second electrode 6 need not have the electron-blocking properties. In this case, the second electrode 6 can be composed of a material that can form an ohmic contact with the photoelectric conversion layer 4.

The light transmittance of each of the first electrode 2 and the second electrode 6 may be greater than or equal to 50%, or may be greater than or equal to 80%. The wavelength of the light transmitted through the electrodes depends on the absorption wavelength of the photoelectric conversion layer 4. Each of the first electrode 2 and the second electrode 6 has a thickness of, for example, greater than or equal to 1 nm and less than or equal to 1,000 nm.

Photoelectric Conversion Layer 4

The photoelectric conversion layer 4 may contain a perovskite compound composed of a monovalent cation, a divalent cation, and halogen anions, as a light-absorbing material. In this case, the solar cell 100 is a perovskite solar cell. As mentioned above, the perovskite compound refers to a perovskite crystal structure represented by the chemical formula $ABX_3$ and a structure having a crystal similar thereto. A is a monovalent cation, B is a divalent cation, and each X is a halogen anion. Examples of the monovalent cation A include alkali metal cations and organic cations. Specific examples of the cation A include a methylammonium cation ($CH_3NH_3^+$), a formamidinium cation ($NH_2CHNH_2^+$), and a cesium cation ($Cs^+$). Examples of the divalent cation B include a Pb cation (lead cation) and a Sn cation. The divalent cation B may be a Pb cation. Each of the sites of the cation A, the cation B, and the anion X may be occupied by multiple types of ions.

The photoelectric conversion layer 4 may mainly contain a perovskite compound. The photoelectric conversion layer 4 may consist essentially of a perovskite compound. In this specification, the expression "mainly contain" a substance indicates that the amount of the substance contained is greater than or equal to 50% by mole. The amount of the substance contained may be greater than or equal to 60% by mass, greater than or equal to 70% by mass, or greater than or equal to even 80% by mass. In this specification, the expression "consist essentially of" a substance indicates that the amount of the substance contained is greater than or equal to 90% by mass. The amount of the substance contained may be greater than or equal to 95% by mass. The photoelectric conversion layer 4 may further contain a compound other than the perovskite compound. The photoelectric conversion layer 4 may contain impurities.

The photoelectric conversion layer 4 is not limited to the above examples. The photoelectric conversion layer 4 may mainly contain a compound semiconductor contained in the photoelectric conversion layer included in a CIS solar cell, or may consist essentially of the compound semiconductor. A typical example of the compound semiconductor is a compound semiconductor mainly containing copper (Cu), indium (In), and selenium (Se).

The technique of the present disclosure is particularly advantageous for perovskite solar cells, in which a difficulty lies in improving the conversion efficiency because of the presence of heterointerfaces.

The photoelectric conversion layer 4 has a thickness of, for example, greater than or equal to 100 nm and less than or equal to 10 μm. The photoelectric conversion layer 4 may have a thickness of greater than or equal to 100 nm and less than or equal to 1,000 nm. The thickness of the photoelectric conversion layer 4 can depend on the amount of light absorbed by the photoelectric conversion layer 4.

Hole Transport Layer 5

The solar cell 100 illustrated in FIG. 1 further includes the hole transport layer 5 between the second electrode 6 and the photoelectric conversion layer 4. The hole transport layer 5 is composed of, for example, an organic semiconductor or an inorganic semiconductor. The hole transport layer 5 may have multiple layers composed of different materials from each other.

Examples of organic semiconductors include phenylamines and triphenylamine derivatives containing tertiary amines in their skeletons; and PEDOT compounds containing thiophene structures. The molecular weight of such an organic semiconductor is not limited. The organic semiconductor may be a polymer. Typical examples of the organic semiconductor include (i) spiro-OMeTAD: 2,2',7,7'tetrakis (N,N-di-p-methoxyphenylamine)-9,9'-spirobifluorene, (ii) PTAA: poly[bis(4-phenyl)(2,4,6-trimethylphenyl)amine], (iii) P3HT: poly(3-hexylthiophene-2,5-diyl), (iv) PEDOT: poly(3,4-ethylenedioxythiophene), and (v) CuPC: Copper (II) phthalocyanine, triple-sublimed grade.

Examples of inorganic semiconductors include $Cu_2O$, $CuGaO_2$, CuSCN, CuI, $NiO_x$, $MoO_x$, $V_2O_5$, and carbonaceous material, such as graphene oxide.

The hole transport layer 5 may have a thickness of greater than or equal to 1 nm and less than or equal to 1,000 nm, or greater than or equal to 10 nm and less than or equal to 500 nm, The hole transport layer 5 having a thickness within this range may have high hole transportability.

The hole transport layer 5 may contain a supporting electrolyte and a solvent. The supporting electrolyte and solvent can stabilize holes in the hole transport layer 5.

Examples of the supporting electrolyte include ammonium salts and alkali metal salts. Examples of ammonium salts include tetrabutylammonium perchlorate, tetraethylammonium hexafluorophosphate, imidazolium salts, and pyridinium salts. Examples of alkali metal salts include $LiN(SO_2C_nF_{2n+1})_2$, $LiPF_6$, $LiBF_4$, lithium perchlorate, and potassium tetrafluoroborate.

The solvent that can be contained in the hole transport layer 5 may have high ionic conductivity. The solvent may be any of aqueous solvents and organic solvents. From the viewpoint of stabilizing the solute, the solvent may be an organic solvent. Examples of the organic solvent include heterocyclic compounds, such as tert-butylpyridine, pyridine, and n-methylpyrrolidone.

The solvent that can be contained in the hole transport layer 5 may be an ionic liquid. The ionic liquid can be used alone or as a mixture in combination with another solvent. The ionic liquid has the advantages of low volatility and high flame retardancy.

Examples of the ionic liquid include imidazolium compounds, such as 1-ethyl-3-methylim idazolium tetracyanoborate, pyridine compounds, alicyclic amine compounds, aliphatic amine compounds, and azonium amine compounds.

Another Layer

The solar cell 100 can include another layer other than those described above. An example of the another layer is a porous layer. The porous layer is located, for example, between the semiconductor layer 3 and the photoelectric conversion layer 4. The porous layer contains a porous body. The porous body contains pores. The pores contained in the porous layer located between the semiconductor layer 3 and the photoelectric conversion layer 4 extend from a portion in contact with the semiconductor layer 3 to a portion in contact with the photoelectric conversion layer 4, The pores are typically filled with the material contained in the photoelectric conversion layer 4, and electrons can move directly from the photoelectric conversion layer 4 to the semiconductor layer 3.

The porous layer can serve as a base for forming the photoelectric conversion layer 4 on the first electrode 2 and the semiconductor layer 3. The porous layer does not interfere with the light absorption of the photoelectric conversion layer 4 and the transfer of electrons from the photoelectric conversion layer 4 to the semiconductor layer 3.

The porous body that can be included in the porous layer includes, for example, connections of particles of an insulator or a semiconductor. Examples of insulating particles include aluminum oxide particles and silicon oxide particles. Examples of semiconductor particles include inorganic semiconductor particles. Examples of inorganic semiconductors include oxides of metal elements, perovskite oxides of metal elements, sulfides of metal elements, and metal chalcogenides. Examples of the oxides of metal elements include oxides of metal elements, such as Cd, Zn, In, Pb, Mo, W, Sb, Bi, Cu, Hg, Ti, Ag, Mn, Fe, V, Zr, Sr, Ga, Si, and Cr. A specific example of oxides of metal elements is $TiO_2$. Examples of perovskite oxides of metal elements include $SrTiO_3$ and $CaTiO_3$, Examples of sulfides of metal elements include CdS, ZnS, $In_2S_3$, PbS, $MO_2S$, $WS_2$, $Sb_2S_3$, $Bi_2S_3$, $ZnCdS_2$, and $Cu_2S$. Examples of metal chalcogenides include CdSe, $In_2Se_3$, $WSe_2$, HgS, PbSe, and CdTe.

The porous layer may have a thickness of greater than or equal to 0.01 µm and less than or equal to 10 µm, or greater than or equal to 0.1 µm and less than or equal to 1 µm. The porous layer may have a large surface roughness. Specifically, the surface roughness coefficient of the porous layer, given by the value of effective area/projected area, may be greater than or equal to 10, or greater than or equal to 100. The projected area is the area of a shadow formed behind an object when the object is illuminated by light directly in front of it. The effective area is the actual surface area of the object. The effective area can be calculated from (i) the volume determined from the projected area and the thickness of the object, (ii) the specific surface area of a material constituting the object, and (iii) the bulk density of the material constituting the object.

The solar cell 100 is produced, for example, by the following method.

The first electrode 2 is formed on a surface of the substrate 1, For the formation of the first electrode 2, a chemical vapor deposition (hereinafter, referred to as "CVD") method or a sputtering method can be employed.

The semiconductor layer 3 is formed on the first electrode 2. For the formation of the semiconductor layer 3, an application method, such as a spin coating method, can be employed. The semiconductor layer 3 contains a compound containing Na, Zn, and O. When the semiconductor layer 3 is formed by the application method, a solution of a Na raw material and a Zn raw material dissolved in a solvent in a predetermined ratio is applied onto the first electrode 2 by the application method, such as a spin coating method. The formed coating film can be heat-treated in air at a predetermined temperature. The predetermined temperature is, for example, higher than or equal to 300° C. and lower than or equal to 500° C. An example of the Na raw material is sodium acetate. An example of the Zn raw material is zinc acetate. Examples of the solvent include ethoxymethanol, isopropyl alcohol, and ethyl alcohol. The composition ratio (Na/Zn) of the above compound can be controlled by adjusting the amounts of the Na raw material and the Zn raw material contained in the coating solution.

The photoelectric conversion layer 4 is formed on the semiconductor layer 3. For the formation of the photoelectric conversion layer 4 containing a perovskite compound as a light-absorbing material, an application method, such as a spin coating method, can be employed.

The hole transport layer 5 is formed on the photoelectric conversion layer 4. For the formation of the hole transport layer 5, an application method or a printing method can be employed. Examples of the application method include a doctor blade method, a bar coating method, a spraying method, a dip coating method, and a spin coating method. An example of the printing method is a screen printing method. A film composed of a mixture of multiple materials is formed and then pressurized or heat-treated to form the hole transport layer 5. The hole transport layer 5 composed of an organic low-molecular-weight substance or an inorganic semiconductor may be formed by a vacuum deposition method.

The second electrode 6 is formed on the hole transport layer 5. For the formation of the second electrode 6, a CVD method or a sputtering method can be employed.

In this way, the solar cell 100 is produced. However, the method for producing the solar cell 100 is not limited to the above embodiments.

EXAMPLES

A solar cell of the present disclosure will be described in more detail below with reference to examples. However, the solar cell of the present disclosure is not limited to structures described in the examples below.

Example 1

A perovskite solar cell having the same structure as the solar cell 100 illustrated in FIG. 1 was produced with reference to "Room-Temperature Formation of Highly Crystalline Multication Perovskites for Efficient, Low-Cost Solar Cells", Advanced Materials, Volume 29, Issue 15, Apr. 18, 2017, 1606258 [DOI: 10.1002/adma.201606258]. Elements included in the solar cell of Example 1 are described below.
Substrate 1: Glass Substrate
First electrode 2: indium-doped $SnO_2$ layer (available from Geomatec Co., Ltd., surface resistivity: 10 Ω/sq)
Semiconductor layer 3: layer containing compound $Na_2Zn_2O_3$ (thickness: 10 nm)
Photoelectric conversion layer 4: layer mainly containing $CH(NH_2)PbI_3$, which is a perovskite compound
Hole transport layer 5: PTAA layer (containing LiN$(SO_2C_2F_5)_2$ and 4-tert-butylpyridine (t-BP) as supporting electrolyte and solvent, respectively)
Second electrode 6: gold layer (thickness: 80 nm)

A specific production method is described below.

As the substrate 1 and the first electrode 2, a conductive glass substrate (available from Nippon Sheet Glass Co., Ltd.) having a thickness of 1 mm and having an indium-doped $SnO_2$ layer on its surface was provided in a dry room under a dry atmosphere having a dew point of lower than or equal to −40° C.

A mixed solution containing sodium acetate (available from Wako) and zinc acetate (available from Aldrich) was applied by spin coating onto the first electrode 2. The mixed solution was a solution of sodium acetate and zinc acetate dissolved in a mole ratio of 1:1 in ethoxymethanol (available from Aldrich). The mixed solution had a sodium acetate concentration of 0.55 mol/L and a zinc acetate concentration of 0.55 mol/L. The first electrode 2 to which the mixed solution had been applied was heat-treated with a hot plate to form the semiconductor layer 3 containing $Na_2Zn_2O_3$. The heat treatment was performed at 130° C. for 10 minutes and then at 350° C. for 10 minutes. The formed semiconductor layer 3 functioned as an electron transport layer.

A first raw-material solution was applied by spin coating onto the semiconductor layer 3 to form the photoelectric conversion layer 4. The first raw-material solution was an N,N-dimethylformamide (available from Acros) solution and contained compounds below.
0.92 mol/L of $PbI_2$ (available from Tokyo Chemical Industry Co., Ltd.)
0.17 mol/L of $PbBr_2$ (available from Tokyo Chemical Industry Co., Ltd.)
0.83 mol/L of formamidinium iodide (FAI: available from Great Cell Solar)
0.17 mol/L of methylammonium bromide (MABr: available from Great Cell Solar)
dimethyl sulfoxide (available from Acros) containing 0.05 mol/L CsI (available from Iwatani Corporation).

The mixing ratio of dimethyl sulfoxide to N,N-dimethylformamide in the first raw-material solution was 1:4, expressed as a volume ratio.

A second raw-material solution was applied by spin coating onto the photoelectric conversion layer 4 to form the hole transport layer 5. The second raw-material solution was a toluene (available from Acros) solution and contained compounds below.
10 mg of PTAA (available from Aldrich)
5 µL of t-BP (available from Aldrich)
4 µL of a solution of $LiN(SO_2C_2F_5)_2$ (available from Tokyo Chemical Industry Co., Ltd.) in acetonitrile (concentration: 1.8 mol/L)

A gold layer having a thickness of 80 nm was deposited by vapor deposition on the hole transport layer 5 to form the second electrode 6.

In this way, the solar cell of Example 1 was produced. Evaluations described in the items "Evaluation of Semiconductor Layer 3" and "Evaluation of Solar Cell Characteristics" were also performed in the dry room.

Examples 2 to 10

A solar cell of each of Examples 2 to 10 was produced as in Example 1, except that the mixing ratio (mole ratio) of sodium acetate to zinc acetate in the mixed solution used for the formation of the semiconductor layer 3 was changed as given in Table 1 below.

Evaluation of Semiconductor Layer 3

For each of the solar cells of Examples 1 to 10, the semiconductor layer 3 was subjected to XRD analysis. Prior to the XRD analysis, the semiconductor layer 3 was exposed by peeling off the second electrode 6 and dissolving and removing the hole transport layer 5 with a solvent. As the solvent, N,N-dimethylformamide was used. In the XRD analysis, an X-ray diffractometer (available from Rigaku Corporation, Cu anode, λ=0.15418 nm) was used. The XRD analysis was performed on the basis of a 2θ/θ method for thin films.

Figure 2:
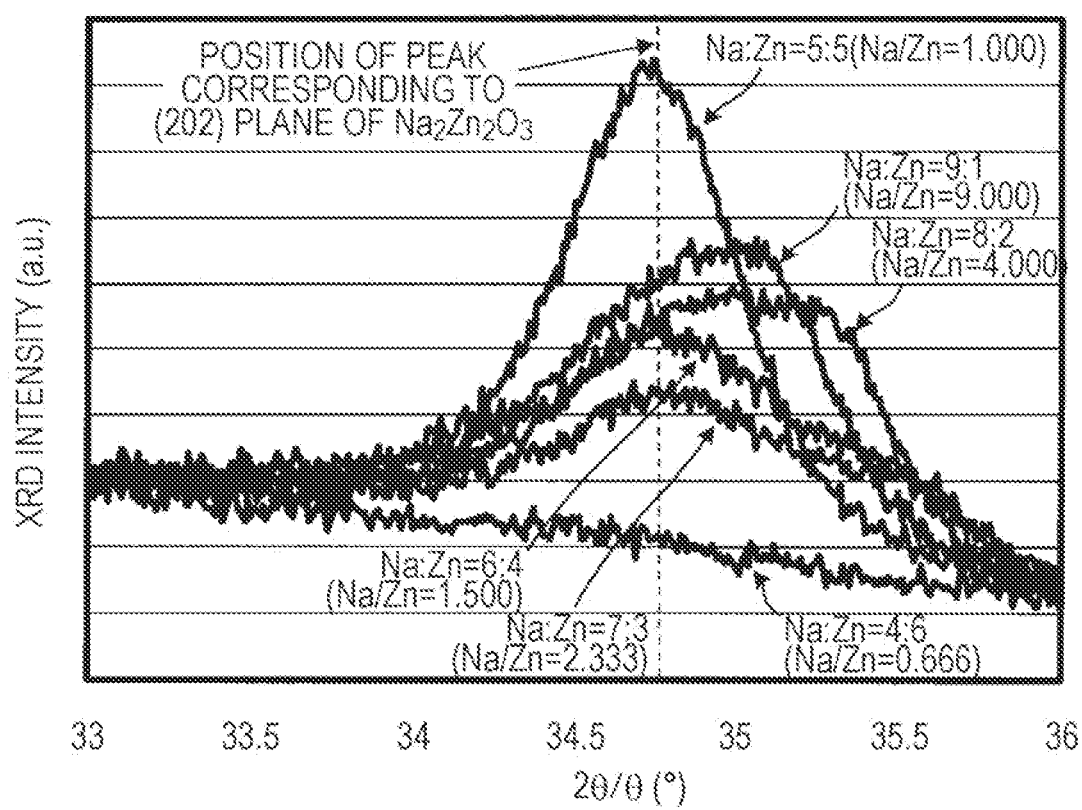
FIG. 2 illustrates a peak corresponding to the (202) plane of $Na_2Zn_2O_3$ and its neighborhood in the X-ray diffraction (hereinafter, referred to as "XRD") pattern of a semiconductor layer produced in each Example.
Figure 3:
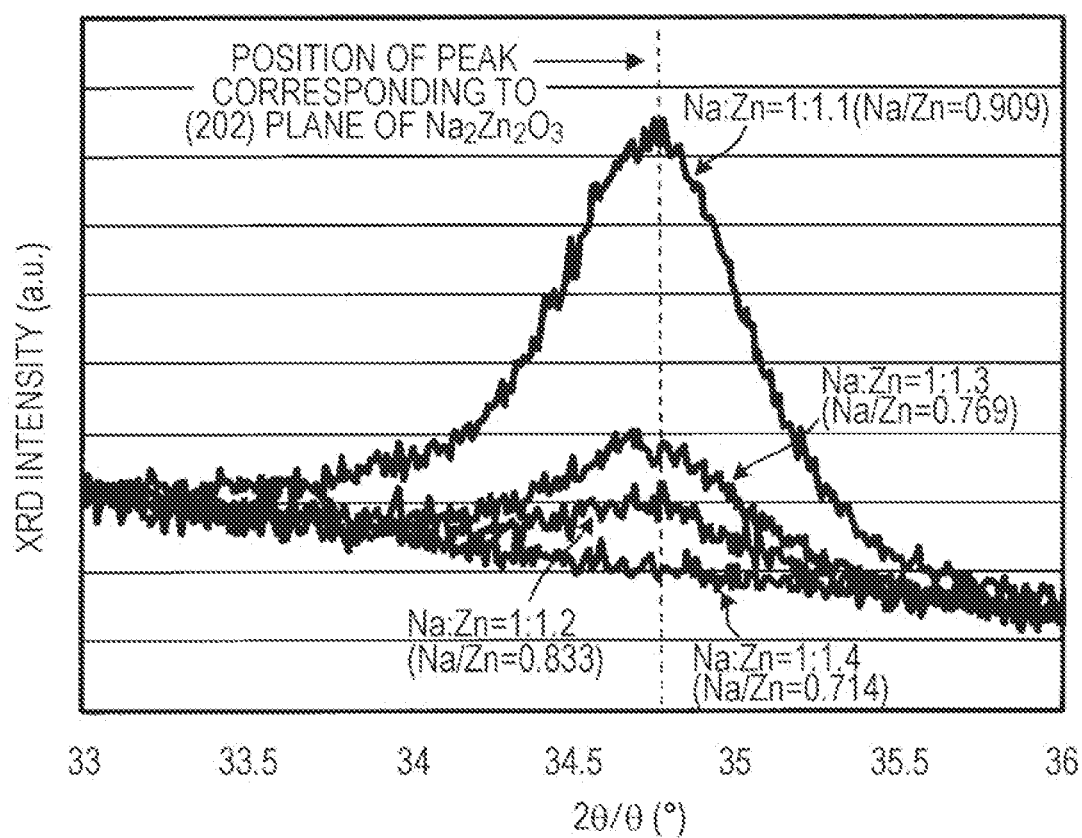
FIG. 3 illustrates a peak corresponding to the (202) plane of $Na_2Zn_2O_3$ and its neighborhood in the XRD pattern of a semiconductor layer produced in each Example.

The results of the XRD analysis are presented in Table 1 below, along with the mixing ratios of sodium acetate to zinc acetate in the mixed solutions used for the formation of the semiconductor layers 3 and the composition ratios Na/Zn calculated from the mixing ratios. FIG. 2 illustrates XRD plots of semiconductor layers 3 with mixing ratios ranging from 9:1 to 4:6. FIG. 3 illustrates XRD plots of the semiconductor layers 3 with the mixing ratios ranging from 1:1.1 to 1:1.4. FIGS. 2 and 3 illustrate a peak (2θ/θ=34.8°) corresponding to the (202) plane of $Na_2Zn_2O$ and its neighborhood in each XRD plot.

Table 1 and FIGS. 2 and 3 indicate that when the composition ratio Na/Zn was less than or equal to 0714, the peak corresponding to the (202) plane of $Na_2Zn_2O_3$ was not observed. When the composition ratio Na/Zn was greater than or equal to 0769, the relevant peak was observed. This indicates that when the composition ratio Na/Zn is less than or equal to 0.714, $Na_2Zn_2O_3$ is not contained in the semiconductor layer 3, whereas when the composition ratio Na/Zn is greater than or equal to 0.769, $Na_2Zn_2O_3$ is contained in the semiconductor layer 3. When the composition ratio Na/Zn was greater than or equal to 4.000, in addition to the above peak originating from $Na_2Zn_2O_3$, a peak of an impurity phase was observed at a diffraction angle 2θ/θ of greater than or equal to 35°. When the composition ratio Na/Zn was less than or equal to 2.333, the peak of the impurity phase was not observed, and the above peak of approximately pure $Na_2Zn_2O_3$ was observed. This indicates that when the composition ratio Na/Zn is less than or equal to 2.333, the $Na_2Zn_2O_3$ layer with fewer impurities can be formed.

TABLE 1

| | Formation of semiconductor layer 3 | | XRD pattern of semiconductor layer 3 | |
|---|---|---|---|---|
| | Mixing ratio of sodium acetate to zinc acetate (mole ratio) | Composition ratio Na/Zn | Peak corresponding to (202) plane of $Na_2Zn_2O_3$ | Peak of impurity phase |
| Exampe 2 | 9:1 | 9.000 | observed | observed |
| Example 3 | 8:2 | 4.000 | observed | observed |
| Example 4 | 7:3 | 2.333 | observed | not observed |
| Example 5 | 6:4 | 1.500 | observed | not observed |
| Example 1 | 5:5 | 1.000 | observed | not observed |
| Example 6 | 1:1.1 | 0.909 | observed | not observed |
| Example 7 | 1:1.2 | 0.833 | observed | not observed |
| Example 8 | 1:1.3 | 0.769 | observed | not observed |
| Example 9 | 1:1.4 | 0.714 | not observed | not observed |
| Example 10 | 4:6 | 0.666 | not observed | not observed |

Example 11

The solar cell of Example 11, which is a comparative example, was produced as in Example 1, except that the solution applied onto the first electrode 2 was changed from the above mixed solution to a solution of zinc acetate only dissolved in ethoxymethanol (concentration: 0.55 mol/L). This solar cell included the electron transport layer composed of ZnO.

Example 12

The solar cell of Example 12, which is a comparative example, was produced as in Example 11, except that before the formation of the photoelectric conversion layer 4, the substrate 1 and the first electrode 2 with the electron transport layer composed of ZnO were immersed in a NaOH solution (concentration: 0.01 mol/L) for 60 seconds for Na treatment of the surface of the electron transport layer. This solar cell included the electron transport layer composed of ZnO and a Na-treated surface.

Example 13

The solar cell of Example 13, which is a comparative example, was produced as in Example 1, except that the solution applied onto the first electrode 2 was changed from the above mixed solution to a mixed solution containing sodium carbonate (available from Wako) and zinc acetate. The mixed solution used in Example 13 was a solution of sodium carbonate and zinc acetate dissolved in ethoxymethanol in a mole ratio of 1:1. The mixed solution had a sodium carbonate concentration of 0.55 mol/L and a zinc acetate concentration of 0.55 mol/L. The solar cell included the electron transport layer composed of a mixture of sodium carbonate ($Na_2CO_3$) and ZnO.

Example 14

The solar cell of Example 14, which is a comparative example, was produced as in Example 1, except that the semiconductor layer 3 was not formed and the electron transport layer composed of $TiO_2$ was formed by a sputtering method.

Evaluation of Solar Cell Characteristics

The open-circuit voltage and conversion efficiency of each produced solar cell were evaluated with a solar simulator (ALS440B, available from BAS). The evaluation was performed using simulated sunlight having an illuminance of 100 mW/cm².

Table 2 below presents the solar cell characteristics in Example 1 and Examples 11 to 14.

TABLE 2

|  | Electron transport layer | Open-circuit voltage/mV | Conversion efficiency/% |
| --- | --- | --- | --- |
| Example 1 | $Na_2Zn_2O_3$ | 1,190 | 14.6 |
| Example 11 | ZnO | 1,075 | 14.0 |
| Example 12 | ZnO (with Na-treated surface) | 1,073 | 11.1 |
| Example 13 | Mixture of ZnO and $Na_2CO_3$ | 1,072 | 10.3 |
| Example 14 | $TiO_2$ | 1,037 | 4.9 |

As presented in Table 2, the solar cell of Example 1, which included the semiconductor layer 3 containing the compound containing Na, Zn, and O, exhibited a higher open-circuit voltage and higher conversion efficiency than the solar cells of Examples 11 to 14. which did not include the semiconductor layer 3. Comparison of Example 1 with Examples 12 and 13 revealed that the semiconductor layer 3 containing Na, Zn, and O in the form of the compound was required to achieve a high open-circuit voltage and high conversion efficiency.

The solar cells of the present disclosure can be used in various applications including those for solar cells in the related art.

What is claimed is:

1. A solar cell, comprising:
   a first electrode;
   a second electrode;
   a photoelectric conversion layer located between the first electrode and the second electrode; and
   a semiconductor layer located between the first electrode and the photoelectric conversion layer,
   wherein at least one selected from the group consisting of the first electrode and the second electrode is translucent,
   the semiconductor layer contains a compound containing Na, Zn, and O, and
   a composition ratio (Na/Zn) of Na to Zn in the compound is greater than or equal to 0.769.

2. The solar cell according to claim 1,
   wherein the composition ratio (Na/Zn) of Na to Zn in the compound is less than or equal to 2.333.

3. The solar cell according to claim 1,
   wherein the compound is $Na_2Zn_2O_3$.

4. The solar cell according to claim 1,
   wherein the semiconductor layer is in contact with the photoelectric conversion layer.

5. The solar cell according to claim 1,
   wherein the semiconductor layer is an electron transport layer.

6. The solar cell according to claim 1, further comprising:
   a hole transport layer located between the second electrode and the photoelectric conversion layer.

7. The solar cell according to claim 1,
   wherein the photoelectric conversion layer contains a perovskite compound composed of a monovalent cation, a divalent cation, and a halogen anion.

8. The solar cell according to claim 7,
   wherein the divalent cation is a lead cation.

* * * * *